United States Patent
Gold et al.

(10) Patent No.: US 10,943,240 B2
(45) Date of Patent: Mar. 9, 2021

(54) ADDITIVELY MANUFACTURED COMPONENT INCLUDING A CONTRAST AGENT FOR PART IDENTIFICATION

(71) Applicant: General Electric Company, Schenectady, NY (US)

(72) Inventors: Scott Alan Gold, Waynesville, OH (US); Thomas Graham Spears, Springdale, OH (US)

(73) Assignee: General Electric Company, Schenectady, NY (US)

( * ) Notice: Subject to any disclaimer, the term of this patent is extended or adjusted under 35 U.S.C. 154(b) by 449 days.

(21) Appl. No.: 15/479,399

(22) Filed: Apr. 5, 2017

(65) Prior Publication Data
US 2018/0293592 A1    Oct. 11, 2018

(51) Int. Cl.
*G06Q 30/00*    (2012.01)
*B22F 3/105*    (2006.01)
*B33Y 10/00*    (2015.01)
*C23C 16/04*    (2006.01)
*B29C 64/153*    (2017.01)
*B33Y 80/00*    (2015.01)
*B22F 3/00*    (2021.01)

(52) U.S. Cl.
CPC ....... *G06Q 30/0185* (2013.01); *B22F 3/1055* (2013.01); *B29C 64/153* (2017.08); *B33Y 10/00* (2014.12); *B33Y 80/00* (2014.12); *C23C 16/042* (2013.01); *B22F 3/008* (2013.01)

(58) Field of Classification Search
CPC .... B22F 3/008; B29C 64/153; G06Q 30/0185
See application file for complete search history.

(56) References Cited

U.S. PATENT DOCUMENTS

| | | | |
|---|---|---|---|
| 2,378,328 A * | 6/1945 | Robinson | G02C 7/021 351/159.02 |
| 4,350,883 A | 9/1982 | Lagarde | |
| 4,806,740 A | 2/1989 | Gold et al. | |
| 5,313,193 A | 5/1994 | Dubois et al. | |
| 5,546,462 A | 8/1996 | Indeck et al. | |
| 6,337,122 B1 | 1/2002 | Grigg et al. | |
| 6,477,227 B1 * | 11/2002 | Kaiser | G01N 23/223 378/45 |
| 6,640,632 B1 | 11/2003 | Hatanaka et al. | |
| 6,850,592 B2 | 2/2005 | Schramm et al. | |
| 6,976,627 B1 | 12/2005 | Culp et al. | |

(Continued)

FOREIGN PATENT DOCUMENTS

WO    WO2016/109111 A1    7/2016

*Primary Examiner* — James Sanders
(74) *Attorney, Agent, or Firm* — Dority & Manning, P.A.

(57) ABSTRACT

A system and method for additively manufacturing a component including features for part identification are provided. The method includes selectively depositing a contrast agent on a cross sectional layer to define a component identifier of the component and directing energy from an energy source onto the contrast agent to fuse the contrast agent and the cross sectional layer. The contrast agent may be an x-ray emission contrast agent that is read using an x-ray emission spectroscopy method, an infrared contrast agent that is read using an infrared camera or an infrared scanner, or a radioactive contrast agent that is read using a gamma ray spectrometer.

20 Claims, 4 Drawing Sheets

(56) References Cited

U.S. PATENT DOCUMENTS

| | | |
|---|---|---|
| 7,148,448 B2 | 12/2006 | Warren, Jr. et al. |
| 7,199,367 B2 | 4/2007 | Favro et al. |
| 7,217,102 B2 | 5/2007 | Rockstroh et al. |
| 7,250,864 B2 | 7/2007 | Murofushi et al. |
| 7,584,833 B2 | 9/2009 | Howells |
| 7,602,963 B2 | 10/2009 | Nightingale et al. |
| 8,222,567 B2 | 7/2012 | Mathai et al. |
| 8,439,258 B1 * | 5/2013 | Hood .................. B42D 25/36 235/435 |
| 8,536,860 B2 | 9/2013 | Boenisch |
| 8,837,672 B2 | 9/2014 | Nance et al. |
| 8,935,286 B1 | 1/2015 | Westerman, Jr. et al. |
| 8,973,829 B2 | 3/2015 | Atkinson et al. |
| 8,985,471 B2 | 3/2015 | Freeman |
| 9,036,916 B2 | 5/2015 | Le |
| 9,074,927 B2 | 7/2015 | Singh et al. |
| 9,250,183 B2 | 2/2016 | Smith et al. |
| 9,311,652 B2 | 4/2016 | Farn et al. |
| 9,360,589 B1 | 7/2016 | Meinhold et al. |
| 9,400,910 B2 | 7/2016 | Kumar et al. |
| 9,414,891 B2 | 8/2016 | Kieser |
| 9,424,503 B2 | 8/2016 | Kieser |
| 2002/0126889 A1 | 9/2002 | Pikler et al. |
| 2008/0159529 A1 | 7/2008 | Aarts et al. |
| 2009/0286007 A1 | 11/2009 | Brancher |
| 2013/0193214 A1 | 8/2013 | Margulis et al. |
| 2014/0205083 A1 | 7/2014 | Pryakhin et al. |
| 2014/0263674 A1 | 9/2014 | Cerveny |
| 2015/0147585 A1 | 5/2015 | Schwarze et al. |
| 2015/0308337 A1 | 10/2015 | Marasco et al. |
| 2015/0324677 A1 | 11/2015 | Talyansky et al. |
| 2016/0107764 A1 | 4/2016 | O'Kell et al. |
| 2016/0207345 A1 | 7/2016 | Farmer et al. |
| 2016/0253586 A1 | 9/2016 | Cook et al. |
| 2016/0260001 A1 | 9/2016 | Flores et al. |
| 2016/0283834 A1 | 9/2016 | Bobbitt, III |
| 2016/0298268 A1 | 10/2016 | Gallucci et al. |
| 2016/0306088 A1 | 10/2016 | Ouderkirk et al. |
| 2016/0307083 A1 | 10/2016 | Kumar et al. |
| 2016/0311164 A1 | 10/2016 | Miyano |
| 2017/0120338 A1 | 5/2017 | Goeing et al. |
| 2017/0232779 A1 * | 8/2017 | Viens .................. B42D 25/324 359/558 |

\* cited by examiner

```
                    ┌─────────────────────────────────────────────┐
          200       │  SELECTIVELY DEPOSITING ONE OR MORE         │ ─ 210
                    │  CONTRAST AGENTS WITHIN ONE OR MORE CROSS   │
                    │  SECTIONAL LAYERS OF THE COMPONENT TO       │
                    │  DEFINE A COMPONENT IDENTIFIER OF A         │
                    │  COMPONENT                                  │
                    └─────────────────────────────────────────────┘
                                         │
                                         ▼
                    ┌─────────────────────────────────────────────┐
                    │  FORMING A DATUM FEATURE ON THE COMPONENT   │ ─ 220
                    │  AT A PREDETERMINED LOCATION RELATIVE TO    │
                    │  AN IDENTIFYING REGION, WHEREIN THE         │
                    │  CONTRAST AGENT IS CONTAINED WITHIN THE     │
                    │  IDENTIFYING REGION                         │
                    └─────────────────────────────────────────────┘
                                         │
                                         ▼
                    ┌─────────────────────────────────────────────┐
                    │  DIRECTING ENERGY FROM AN ENERGY SOURCE     │ ─ 230
                    │  ONTO THE CONTRAST AGENTS TO FUSE THE       │
                    │  CONTRAST AGENTS AND THE CROSS SECTIONAL    │
                    │  LAYER                                      │
                    └─────────────────────────────────────────────┘
```

*FIG. 3*

```
          300
                    ┌─────────────────────────────────────────────┐
                    │  LOCATING AN IDENTIFYING REGION OF THE      │ ─ 310
                    │  COMPONENT, THE IDENTIFYING REGION          │
                    │  COMPRISING A SELECTIVELY POSITIONED        │
                    │  CONTRAST AGENT DEFINING A COMPONENT        │
                    │  IDENTIFIER                                 │
                    └─────────────────────────────────────────────┘
                                         │
                                         ▼
                    ┌─────────────────────────────────────────────┐
                    │  OBTAINING DATA INDICATIVE OF THE           │ ─ 320
                    │  COMPONENT IDENTIFIER BY INTERROGATING      │
                    │  THE IDENTIFYING REGION OF THE COMPONENT    │
                    │  WITH A SCANNER                             │
                    └─────────────────────────────────────────────┘
                                         │
                                         ▼
                    ┌─────────────────────────────────────────────┐
                    │  OBTAINING A REFERENCE IDENTIFIER FROM A    │ ─ 330
                    │  DATABASE                                   │
                    └─────────────────────────────────────────────┘
                                         │
                                         ▼
                    ┌─────────────────────────────────────────────┐
                    │  COMPARING THE COMPONENT IDENTIFIER TO      │ ─ 340
                    │  THE REFERENCE IDENTIFIER                   │
                    └─────────────────────────────────────────────┘
                                         │
                                         ▼
                    ┌─────────────────────────────────────────────┐
                    │  DETERMINING THE COMPONENT IS AUTHENTIC IF  │ ─ 350
                    │  THE COMPONENT IDENTIFIER MATCHES THE       │
                    │  REFERENCE IDENTIFIER                       │
                    └─────────────────────────────────────────────┘
```

*FIG. 4*

ADDITIVELY MANUFACTURED COMPONENT INCLUDING A CONTRAST AGENT FOR PART IDENTIFICATION

FIELD

The present subject matter relates generally to additively manufactured components, and more particularly, to systems and methods for authenticating additively manufactured components including features for improved part identification or counterfeit prevention.

BACKGROUND

Original equipment manufacturers (OEMs) in a variety of industries have an interest in ensuring that replacement components used with their products or equipment are manufactured according to standards set and controlled by the OEM. Using the aviation industry as an example, the manufacturer of a gas turbine engine, as well as the airlines and the passengers that rely on them, can be exposed to serious risks if counterfeit or replica replacement parts are readily available for and installed on these engines.

For example, such counterfeit components can pose a severe risk to the integrity of the gas turbine engines or may otherwise result in a variety of problems for the OEM and the end user. More specifically, OEM components may require rigorous attention to detail to ensure sound material properties and capabilities for the specific application as well as sophisticated inspections to verify the component performance. OEMs cannot ensure the integrity or compatibility of counterfeit parts, which may result in dangerous engine operation and increase the risk of potential failure.

In addition, counterfeit parts compromise the OEMs ability to control the quality associated with their products. For example, inexpensive replicas and inferior components on the market are a real threat, both to the engines on which they are installed and to the reputation of the OEM. Moreover, failure of a gas turbine engine due to a counterfeit replacement component might subject the OEM to misdirected legal liability and OEMs may lose a significant revenue stream by not being able to control the sale of OEM replacement components.

Additive manufacturing technologies are maturing at a fast pace. For example, very accurate additive manufacturing printers using a variety of materials, such as metals and polymers, are becoming available at decreasing costs. In addition, improved scanning technologies and modeling tools are now available. As a result, certain OEMs are beginning to use such technologies to produce original and replacement parts. However, the advance of additive manufacturing technologies also results in a lower barrier to entry into the additive manufacturing space. Therefore, replacement components may be more easily reverse engineered and copied, and there is an increased risk of third parties manufacturing and installing counterfeit components on OEM equipment, such as a gas turbine engine, resulting in the dangers described briefly above.

There is thus a need for a technology that allows genuine parts to be distinguished from counterfeits to ensure that parts created through additive manufacturing cannot be duplicated by an unauthorized third party and passed off as genuine OEM parts. Accordingly, systems and methods for authenticating additively manufactured components to distinguish genuine parts from counterfeit parts would be useful.

BRIEF DESCRIPTION

Aspects and advantages of the invention will be set forth in part in the following description, or may be obvious from the description, or may be learned through practice of the invention.

In one exemplary embodiment of the present disclosure, a method of manufacturing a component is provided. The method includes selectively depositing one or more contrast agents within one or more cross sectional layers of the component to define a component identifier of the component. The method further includes directing energy from an energy source onto the contrast agents to fuse the contrast agents and the cross sectional layer.

In another exemplary aspect of the present disclosure, a method of additively manufacturing a surface of a component is provided. The method includes depositing a layer of additive material onto the component, the layer of additive material comprising a contrast agent selectively positioned to form a component identifier of the component. The method further includes directing energy from an energy source onto a portion of the layer of additive material to fuse the portion of the layer of powder and the contrast agent onto the component.

In still another exemplary aspect of the present disclosure, a method of authenticating a component is provided. The method includes locating an identifying region of the component, the identifying region including a selectively positioned contrast agent defining a component identifier. The method further includes obtaining data indicative of the component identifier by interrogating the identifying region of the component with a scanner and determining that the component is authentic based on the data acquired by the scanner.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures.

FIG. 3 is a method for additively manufacturing a component according to an exemplary embodiment of the present subject matter.

FIG. 4 is a method for authenticating a component according to an exemplary embodiment of the present subject matter.

Figure 1:
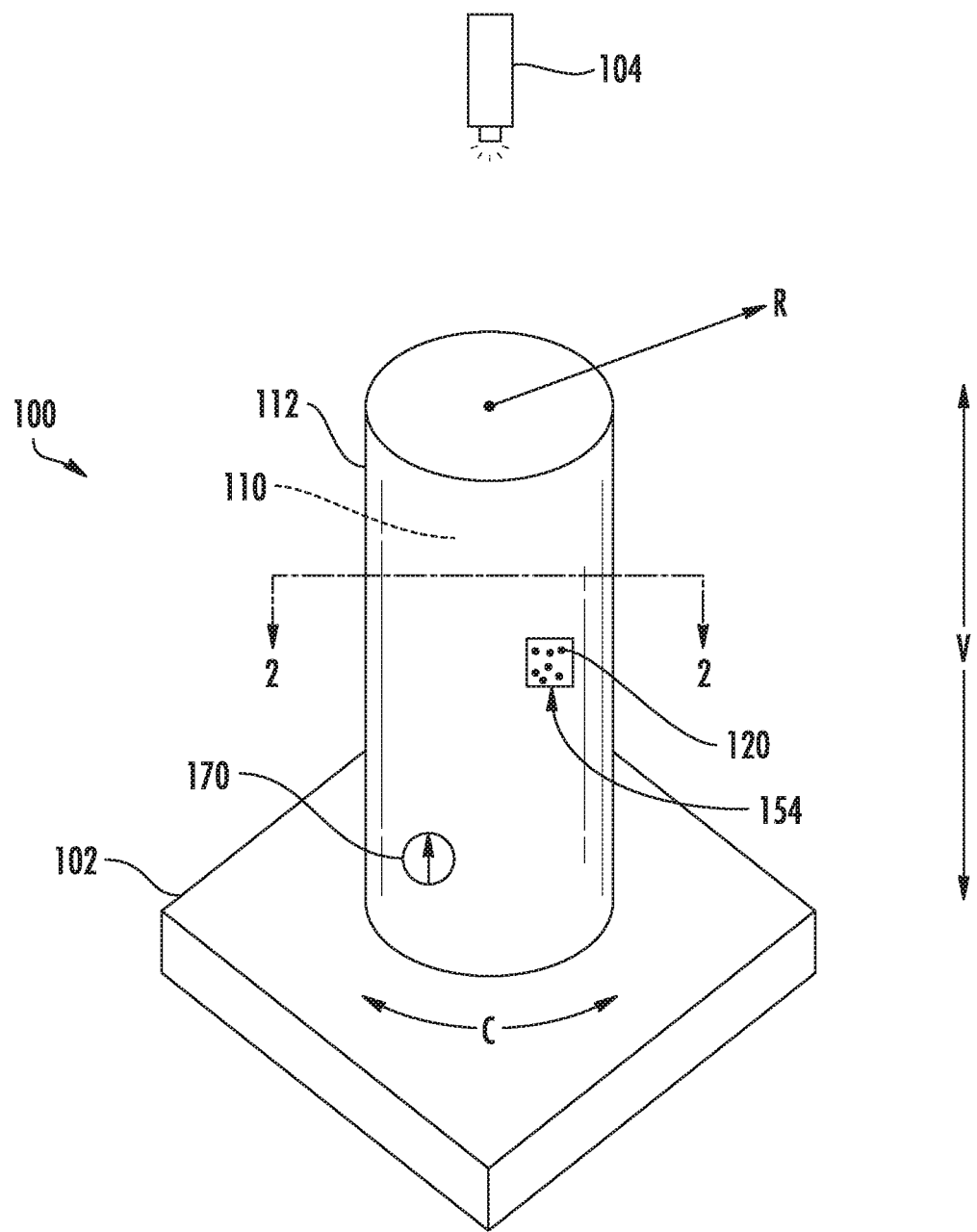
FIG. 1 provides a perspective view of an additively manufactured component according to an exemplary embodiment of the present subject matter.

Repeat use of reference characters in the present specification and drawings is intended to represent the same or analogous features or elements of the present invention.

DETAILED DESCRIPTION

Reference will now be made in detail to present embodiments of the invention, one or more examples of which are illustrated in the accompanying drawings. The detailed description uses numerical and letter designations to refer to features in the drawings. Like or similar designations in the drawings and description have been used to refer to like or similar parts of the invention.

The present disclosure is generally directed to a system and method for additively manufacturing a component including features for part identification. The method includes selectively depositing a contrast agent on an interior body layer to define a component identifier of the component and directing energy from an energy source onto the contrast agent to fuse the contrast agent and the interior body layer. The contrast agent may be an x-ray emission contrast agent that is read using an x-ray emission spectroscopy method, an infrared contrast agent that is read using an infrared camera or an infrared scanner, or a radioactive contrast agent that is read using a gamma ray spectrometer.

In general, the components described herein may be manufactured or formed using any suitable process. However, in accordance with several aspects of the present subject matter, these components may be formed using an additive-manufacturing process, such as a 3-D printing process. The use of such a process may allow the components to be formed integrally, as a single monolithic component, or as any suitable number of sub-components. In particular, the manufacturing process may allow these components to be integrally formed and include a variety of features not possible when using prior manufacturing methods. For example, the additive manufacturing methods described herein enable the manufacture of components having various features, configurations, thicknesses, materials, densities, and identifying features not possible using prior manufacturing methods. Some of these novel features are described herein.

As used herein, the terms "additively manufactured" or "additive manufacturing techniques or processes" refer generally to manufacturing processes wherein successive layers of material(s) are provided on each other to "build-up," layer-by-layer, a three-dimensional component. The successive layers generally fuse together to form a monolithic component which may have a variety of integral sub-components. Although additive manufacturing technology is described herein as enabling fabrication of complex objects by building objects point-by-point, layer-by-layer, typically in a vertical direction, other methods of fabrication are possible and within the scope of the present subject matter. For example, although the discussion herein refers to the addition of material to form successive layers, one skilled in the art will appreciate that the methods and structures disclosed herein may be practiced with any additive manufacturing technique or manufacturing technology. For example, embodiments of the present invention may use layer-additive processes, layer-subtractive processes, or hybrid processes.

Suitable additive manufacturing techniques in accordance with the present disclosure include, for example, Fused Deposition Modeling (FDM), Selective Laser Sintering (SLS), 3D printing such as by inkjets and laserjets, Sterolithography (SLA), Direct Selective Laser Sintering (DSLS), Electron Beam Sintering (EBS), Electron Beam Melting (EBM), Laser Engineered Net Shaping (LENS), Laser Net Shape Manufacturing (LNSM), Direct Metal Deposition (DMD), Digital Light Processing (DLP), Direct Selective Laser Melting (DSLM), Selective Laser Melting (SLM), Direct Metal Laser Melting (DMLM), and other known processes.

The additive manufacturing processes described herein may be used for forming components using any suitable material. For example, the material may be plastic, metal, concrete, ceramic, polymer, epoxy, photopolymer resin, or any other suitable material that may be in solid, liquid, powder, sheet material, wire, or any other suitable form. More specifically, according to exemplary embodiments of the present subject matter, the additively manufactured components described herein may be formed in part, in whole, or in some combination of materials including but not limited to pure metals, nickel alloys, chrome alloys, titanium, titanium alloys, magnesium, magnesium alloys, aluminum, aluminum alloys, and nickel or cobalt based superalloys (e.g., those available under the name Inconel® available from Special Metals Corporation). These materials are examples of materials suitable for use in the additive manufacturing processes described herein, and may be generally referred to as "additive materials."

In addition, one skilled in the art will appreciate that a variety of materials and methods for bonding those materials may be used and are contemplated as within the scope of the present disclosure. As used herein, references to "fusing" may refer to any suitable process for creating a bonded layer of any of the above materials. For example, if an object is made from polymer, fusing may refer to creating a thermoset bond between polymer materials. If the object is epoxy, the bond may be formed by a crosslinking process. If the material is ceramic, the bond may be formed by a sintering process. If the material is powdered metal, the bond may be formed by a melting or sintering process. One skilled in the art will appreciate that other methods of fusing materials to make a component by additive manufacturing are possible, and the presently disclosed subject matter may be practiced with those methods.

In addition, the additive manufacturing process disclosed herein allows a single component to be formed from multiple materials. Thus, the components described herein may be formed from any suitable mixtures of the above materials. For example, a component may include multiple layers, segments, or parts that are formed using different materials, processes, and/or on different additive manufacturing machines. In this manner, components may be constructed which have different materials and material properties for meeting the demands of any particular application. In addition, although the components described herein are constructed entirely by additive manufacturing processes, it should be appreciated that in alternate embodiments, all or a portion of these components may be formed via casting, machining, and/or any other suitable manufacturing process. Indeed, any suitable combination of materials and manufacturing methods may be used to form these components.

An exemplary additive manufacturing process will now be described. Additive manufacturing processes fabricate components using three-dimensional (3D) information, for example a three-dimensional computer model, of the component. Accordingly, a three-dimensional design model of the component may be defined prior to manufacturing. In this regard, a model or prototype of the component may be scanned to determine the three-dimensional information of the component. As another example, a model of the component may be constructed using a suitable computer aided design (CAD) program to define the three-dimensional design model of the component.

The design model may include 3D numeric coordinates of the entire configuration of the component including both external and internal surfaces of the component. For example, the design model may define the body, the surface, and/or any surface features such as contrast agents, component identifiers, or datum features, as well as internal passageways, openings, support structures, etc. In one exemplary embodiment, the three-dimensional design model is converted into a plurality of slices or segments, e.g., along a central (e.g., vertical) axis of the component or any other suitable axis. Each slice may define a thin cross section of the component for a predetermined height of the slice. The plurality of successive cross-sectional slices together form the 3D component. The component is then "built-up" slice-by-slice, or layer-by-layer, until finished.

In this manner, the components described herein may be fabricated using the additive process, or more specifically each layer is successively formed, e.g., by fusing or polymerizing a plastic using laser energy or heat or by sintering or melting metal powder. For example, a particular type of additive manufacturing process may use an energy beam, for example, an electron beam or electromagnetic radiation such as a laser beam, to sinter or melt a powder material. Any suitable laser and laser parameters may be used, including considerations with respect to power, laser beam spot size, and scanning velocity. The build material may be formed by any suitable powder or material selected for enhanced strength, durability, and useful life, particularly at high temperatures.

Each successive layer may be, for example, between about 10 μm and 200 μm, although the thickness may be selected based on any number of parameters and may be any suitable size according to alternative embodiments. Therefore, utilizing the additive formation methods described above, the components described herein may have cross sections as thin as one thickness of an associated powder layer, e.g., 10 μm, utilized during the additive formation process.

Notably, in exemplary embodiments, several features of the components described herein were previously not possible due to manufacturing restraints. However, the present inventors have advantageously utilized current advances in additive manufacturing techniques to develop exemplary embodiments of such components generally in accordance with the present disclosure. While the present disclosure is not limited to the use of additive manufacturing to form these components generally, additive manufacturing does provide a variety of manufacturing advantages, including ease of manufacturing, reduced cost, greater accuracy, etc.

In this regard, utilizing additive manufacturing methods, even multi-part components may be formed as a single piece of continuous metal, and may thus include fewer subcomponents and/or joints compared to prior designs. The integral formation of these multi-part components through additive manufacturing may advantageously improve the overall assembly process. For example, the integral formation reduces the number of separate parts that must be assembled, thus reducing associated time and overall assembly costs. Additionally, existing issues with, for example, leakage, joint quality between separate parts, and overall performance may advantageously be reduced.

Also, the additive manufacturing methods described above enable much more complex and intricate shapes and contours of the components described herein. For example, such components may include thin additively manufactured layers and novel surface features. All of these features may be relatively complex and intricate for avoiding detection and/or impeding counterfeiting by a third party. In addition, the additive manufacturing process enables the manufacture of a single component having different materials such that different portions of the component may exhibit different performance characteristics. The successive, additive nature of the manufacturing process enables the construction of these novel features. As a result, the components described herein may exhibit improved performance and may be easily distinguished from replicas or counterfeit components.

Figure 2:
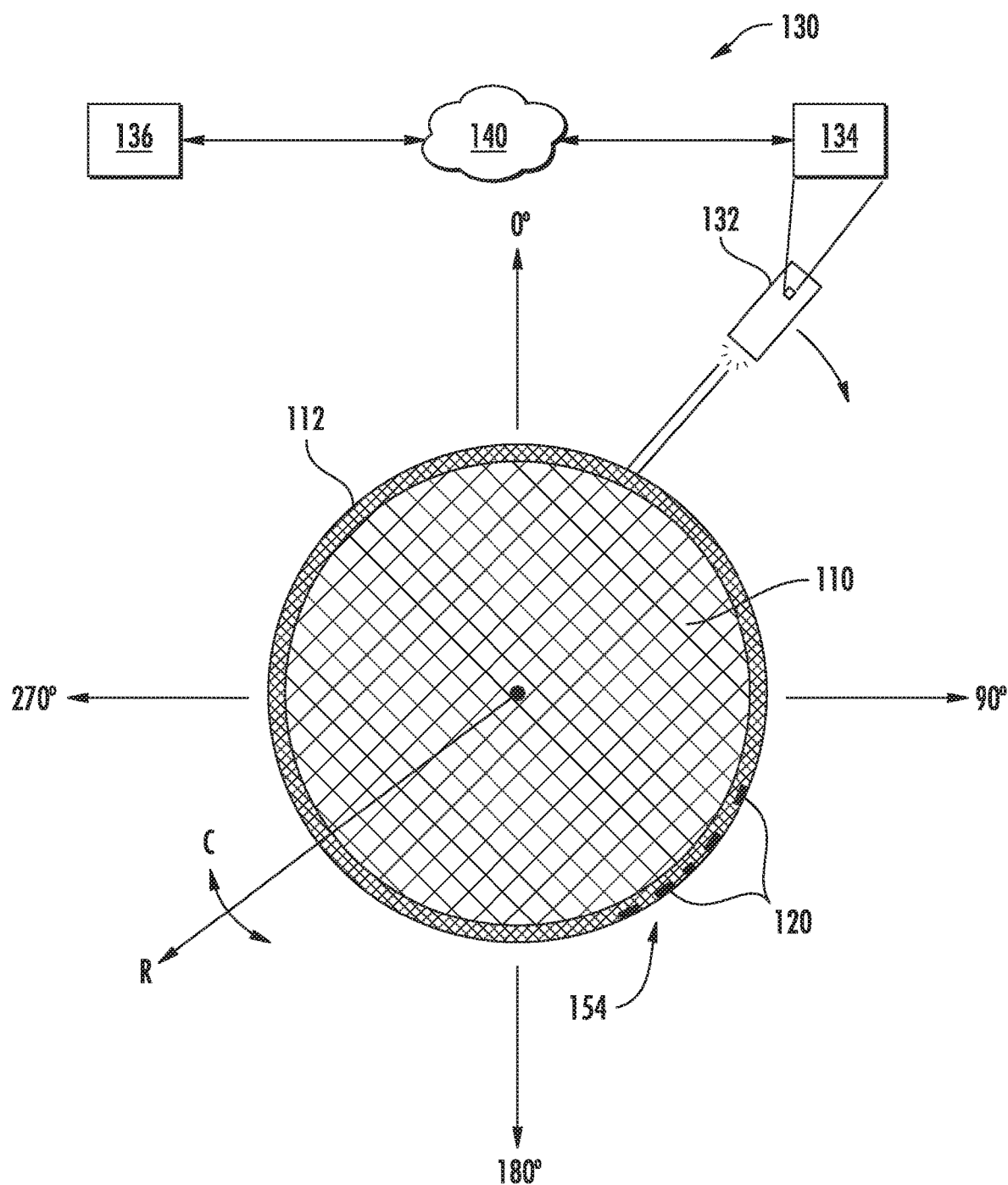
FIG. 2 provides a cross sectional view of the exemplary component of FIG. 1, taken along Line 2-2 of FIG. 1.

Referring now to FIGS. 1 and 2 an additively manufactured component 100 according to an exemplary embodiment of the present subject matter is provided. More specifically, FIG. 1 provides a perspective view of component 100 and FIG. 2 provides a cross sectional view of component 100, taken along Line 2-2 of FIG. 1. Referring now specifically to FIG. 1, for the purpose of explaining aspects of the present subject matter, component 100 is a simple, solid cylinder. However, it should be appreciated that the additive manufacturing methods described herein may be used to form any suitable component for any suitable device, regardless of its material or complexity. As illustrated, component 100 generally defines a radial direction R, a circumferential direction C, and a vertical direction V.

Also illustrated in FIG. 1 is an additive manufacturing platform 102 and an energy source 104, as may be used according to any of the additive manufacturing methods described above. For example, component 100 may be constructed by laying a powder bed onto platform 102 and selectively fusing the powder bed at desired locations using energy source 104 to form a layer of component 100. Platform 102 may be lowered along the vertical direction V after each layer is formed and the process may be repeated until component 100 is complete.

Referring to FIG. 2, a cross sectional view of component 100 taken along Line 2-2 (or more specifically, a plane corresponding to this line) will be described. It should be appreciated that FIG. 2 illustrates a top view of a single additively manufactured layer of component 100 having a finite thickness. As illustrated, component 100 includes a cross sectional layer 110. Cross sectional layer 110 may generally define an interior body layer and a surface 112. As used herein, "interior body layer" may refer to any structure, body, surface, base layer, or other portion of component 100 on which a surface may be formed. In this regard, for example, component 100 includes surface 112 that is formed around cross sectional layer 110, i.e., along a perimeter or periphery of cross sectional layer 110 along the circumferential direction C. As used herein, "surface" may refer to the periphery of one or more cross sectional layer 110 of component 100, e.g., formed on an otherwise exposed interior body layer.

According to the illustrated embodiment, cross sectional layer 110 and surface 112 may be formed at different energy levels and may have different structural characteristics. As used herein, an "energy level" of an energy source is used generally to refer to the magnitude of energy the energy source delivers to a particular point or region of component 100. For example, if the energy source is a laser or an electron beam, the energy level is generally a function of the power level and the scan speed of the laser or electron beam. As used herein, "scan speed" is used generally to refer to the linear velocity of the energy source along a surface of the additively manufactured component. Notably, the energy level of an energy source directed toward a powder bed may also be adjusted by increasing or decreasing the overlap between adjacent passes of the energy source over the powder bed.

Adjusting the energy level of energy source 104 can enable the formation of component 100 with different regions having different densities and structural properties. For example, a higher energy level may be achieved by increasing the power level of energy source 104 (e.g., in Watts), decreasing its scan speed, or increasing the overlap between adjacent passes of energy source 104 to direct more energy onto a single area of the powder bed. By contrast, a lower energy level may be achieved by decreasing the power level of energy source 104, increasing its scan speed, or decreasing the overlap between adjacent passes of energy source 104 to direct less energy onto a single area of the powder bed.

According to the exemplary embodiment, component 100 is formed by moving energy source 104 (or more specifically, a focal point of the energy source 104, as shown in FIG. 1) along a powder bed placed on platform 102 to fuse together material to form component 100. According to the exemplary embodiment, a first energy level (e.g., a higher energy level) is used to form cross sectional layer 110 and a second energy level (e.g., a lower energy level) is used to form surface 112. It should be appreciated that this is only one exemplary construction of component 100. According to alternative embodiments, components formed using the methods described herein may have any suitable size and number of sections formed using any suitable energy source, at any suitable energy level, and having any suitable scanning strategy.

According to exemplary embodiments of the present subject matter, component 100 may include a component identifier that may be used by the component manufacturer, an end user, or another third party to authenticate or positively identify component 100. The component identifier may be unique to a specific component, may be associated with a group of components manufactured at the same time, or may refer to a type of component in general. In this regard, for example, the component identifier may be integrated into or onto surface 112 of component 100 such that the component identifier remains on component 100 throughout the lifetime of component 100. Exemplary component identifiers may be any sequence of features such as bumps, divots, or other surface aberrations that contain or define encoded information in a manner analogous to a printed serial number, a bar code, or a QR code, e.g., for uniquely identifying component 100. For example, the component identifier may include a contrast agent 120 selectively deposited on surface 112 of component 100 in a specific pattern or sequence to define the component identifier of component 100.

According to the illustrated embodiment, contrast agent 120 is deposited as a component identifier while forming surface 112 of additively manufactured component 100. However, according to alternative embodiments, contrast agent 120 may be part of cross sectional layer 110 or any other suitable portion of component 100. As used herein, "contrast agent" may generally refer to any material that may be deposited on and fused with a component and may be distinguished from the primary material of the component. In this manner, the location and pattern of contrast agent 120 may be detected relative to the primary material to read the component identifier.

According to one exemplary embodiment, contrast agent 120 is a secondary x-ray emission contrast agent. As used herein, "x-ray contrast agent" refers to any material, composition, or compound capable of emitting x-rays at a different wavelength from the base material when suitably excited. Such an x-ray contrast agent may be detected using any suitable method, such as x-ray fluorescence (XRF), confocal XRF, electron microprobe, particle induced x-ray emission (PIXE) spectroscopy.

According to another exemplary embodiment, contrast agent 120 is an electron emission contrast agent. As used herein, "electron contrast agent" refers to any material, composition, or compound capable of emitting electrons at different characteristic energies from the base material when suitably excited. Such an electron contrast agent may be detected using any suitable methods, such as Auger electron spectroscopy, and/or x-ray photoelectron spectroscopy (XPS).

According to another exemplary embodiment, contrast agent 120 is an infrared emission contrast agent. As used herein, "infrared emission contrast agent" refers to any material, composition, or compound with a measurably significant infrared emissivity from the base material of the component. Such an infrared emission contrast agent may be read using an infrared camera or sensor. Alternatively, the infrared contrast agent may be read visually by heating component 100. According to still other embodiments, any suitable method of reading the emission infrared contrast agent may be used while remaining within the scope of the present subject matter.

According to another exemplary embodiment, contrast agent 120 is an infrared absorption contrast agent. As used herein, "infrared absorption contrast agent" refers to any material, composition, or compound with a measurably significant infrared absorptivity from the base material of the component. Such an infrared absorption contrast agent may be read using an infrared spectrometer in transmission, reflection, or attenuated total reflectance modes. According to still other embodiments, any suitable method of reading infrared absorption contrast agent may be used while remaining within the scope of the present subject matter.

According to another exemplary embodiment, contrast agent 120 is an ultraviolet contrast agent. As used herein, "ultraviolet contrast agent" refers to any material, composition, or compound with a measurably significant ultraviolet absorptivity from the base material of the component. Such an ultraviolet contrast agent may be read using an ultraviolet sensor or spectrometer in transmission or reflectance modes. According to still other embodiments, any suitable method of reading the ultraviolet contrast agent may be used while remaining within the scope of the present subject matter.

According to still another exemplary embodiment, contrast agent is a radioactive contrast agent. As used herein, "radioactive contrast agent" refers to any material, composition, or compound capable of emitting energy in the form of waves, particularly at gamma ray wavelengths (e.g., less than about 10 picometers). The ratio of isotopes selected for contrast agent 120 could be unique to the manufacturer and/or component 100. The presence of contrast agent 120 would not be detectable except through gamma spectrum monitors and is capable of surviving hot environments. Such a radioactive contrast agent may be read using a gamma ray spectrometer or any other suitable radiation monitoring device.

Contrast agents 120, whether they are x-ray, electron, infrared, ultraviolet, or radioactive contrast agents, may be joined with component 100 using any suitable method. For example, additive manufacturing methods may be used to selectively deposit contrast agent 120. According to an exemplary embodiment, powder or particulate contrast agent 120 may be directly deposited within the powder bed before fusing. According to alternative embodiments, contrast agents 120 may be fused to component 100 post-manufacturing. In this regard, for example, component 100 may be additively manufactured, cast, machined, or otherwise manufactured prior to selectively depositing and fusing contrast agent 120 to its surface 112.

According to another embodiment, a radioactive contrast agent may be introduced into the powder bed in the form of a pellet or pellets of custom blended radioactive isotopes. According to still other embodiments, contrast agents 120 may be joined to component 100 using chemical vapor deposition, as is known in the art. An exemplary chemical vapor deposition process may include positioning a shadow mask over surface 112 of component 100. The shadow mask acts as a precise stencil that defines the component identifier. Volatile precursors containing contrast agent 120 may be applied over the shadow mask which only allows deposits in specific areas on surface 112 to define the component identifier.

Although x-ray, electron, infrared, ultraviolet, and radioactive contrast agents 120 are described above, it should be appreciated that other types of contrast agents may be used while remaining within the scope of the present subject matter. In this regard, for example, any other suitable contrast agent could be deposited at any suitable location within component 100, e.g., within base component 110, surface 112, or at any other suitable location within component 100 that is readable by a scanner, as discussed herein. Moreover, aspects of the present subject matter may be applied to existing components, whether such components are manufactured using an additive process or other conventional manufacturing methods, e.g., casting, molding, machining, etc. In this regard, for example, a contrast agent may be deposited onto a previously manufactured component and fused with the component to serve as the component identifier.

It should be appreciated that component 100 is described herein only for the purpose of explaining aspects of the present subject matter. For example, component 100 will be used herein to describe exemplary methods of manufacturing and authenticating additively manufactured components. It should be appreciated that the additive manufacturing techniques discussed herein may be used to manufacture other components for use in any suitable device, for any suitable purpose, and in any suitable industry. Furthermore, the authentication methods described herein may be used to identify, authenticate, or otherwise distinguish such components. Thus, the exemplary components and methods described herein are used only to illustrate exemplary aspects of the present subject matter and are not intended to limit the scope of the present disclosure in any manner.

Referring still to FIG. 2, an authentication system 130 will be described according to exemplary embodiments of the present subject matter. Authentication system 130 may generally include a scanning device 132 configured for detecting the presence of, reading a pattern of, or otherwise mapping contrast agent 120 on surface 112 of component 100. In general, scanning device 132 is any device suitable for sensing, measuring, or reading a contrast agent within surface 112 of component 100. Notably, the type of scanning device 132 used may depend on the type of contrast agent 120 deposited. Examples of the different types of devices for reading various contrast agents 120 are described above, but are not intended to limit the scope of the present subject matter. In general, scanning device 132 may pass over surface 112 of component 100 in any suitable manner to read contrast agent 120. Contrast agent 120 may be selectively deposited all over surface 112 of component 100 or may be localized to one or more identifying regions 154 on surface 112, as explained below.

According to the illustrated embodiment, scanning device 132 includes a controller 134 which is generally configured for receiving, analyzing, transmitting, or otherwise utilizing data acquired by scanning device 132. Controller 134 can include various computing device(s) (e.g., including processors, memory devices, etc.) for performing operations and functions, as described herein. For reasons described in more detail below, scanning device 132, or more specifically, controller 134, may further be in communication with a database or remote computing system 136, e.g., via a network 140, and may be configured for transmitting or receiving information related to component 100, e.g., such as its component identifier.

It may be desirable to make locating and identifying contrast agent 120 more difficult, e.g., to avoid detection using conventional low-tech scanning means. In this regard, for example, contrast agent 120 may not be visible to the human eye. However, it may further be desirable to desirable to include one or more additional features on component 100 which assist the manufacturer or an end user in locating identifying region 154 which may contain contrast agent 120. Thus, for example, to avoid the need to scan the entire surface 112 to locate and read contrast agent 120, one or more datum features may be used as a reference from which an authorized end user may find identifying region 154.

More specifically, referring again to FIG. 1, component 100 further includes a datum feature 170 that is visible to the human eye or otherwise easily detectable. For example, according to the exemplary embodiment, datum feature 170 has a size that is greater than about one millimeter. Moreover, datum feature 170 may indicate both a position and an orientation of component 100. According to the illustrated embodiment, datum feature 170 is formed within surface 112 of component 100. However, it should be appreciated that according to alternative embodiments, datum feature 170 may be formed within the interior of component 100 or cross sectional layer 110 and/or within both the interior of cross sectional layer 110 and surface 112 of component.

Datum feature 170 is located at a predetermined location relative to identifying region 154—and thus the component identifier as defined by contrast agent 120. In this manner, an authorized third party who knows the relative positioning of datum feature 170 and identifying region 154 may easily locate datum feature 170 and use it as a reference for locating and scanning identifying region 154 to read contrast agent 120.

Now that the construction and configuration of component 100 according to an exemplary embodiment of the present subject matter has been presented, an exemplary method 200 for forming a component according to an exemplary embodiment of the present subject matter is provided. Method 200 can be used by a manufacturer to form component 100, or any other suitable part or component. It should be appreciated that the exemplary method 200 is discussed herein only to describe exemplary aspects of the present subject matter, and is not intended to be limiting.

Referring now to FIG. 3, method 200 includes, at step 210, selectively depositing one or more contrast agents within one or more cross sectional layers of the component to define a component identifier of the component. Notably, the cross sectional layer may be additively manufactured such as described above with respect to component 100 or may formed using any other suitable manufacturing method. As explained above, the contrast agent may be an x-ray, electron, infrared, ultraviolet, radioactive, or other suitable contrast agent. In addition, the contrast agent may be deposited on a surface of the component during or after manufacturing. More specifically, the contrast agent may be deposited as all or part of a layer that is fused during the additive manufacturing process or may be deposited and fused to a pre-formed component.

As explained above, the contrast agent may be deposited into an identifying region which may be any area on the component that contains a component identifier of the component. For example, identifying region 154 of component 100 contains a sequence or pattern of deposited contrast agent 120 that collectively defines a component identifier. It should be appreciated that the contrast agent could be deposited to form a printed number, a bar code, a QR code, or any other suitable sequence or pattern to form a component identifier. Moreover, according to alternative embodiments, more than one contrast agent may be used to form one or more component identifiers in one or more identifying regions.

According to exemplary embodiments of the present subject matter, method 200 further includes, at step 220, forming a datum feature on the component at a predetermined location relative to the identifying region. In this regard, the datum feature may assist in locating the identifying region, e.g., when the component identifier is not readily detectable. For example, because the contrast agent is not typically visible through conventional inspection methods, e.g., through visible inspection, an end user without knowledge of the relative positioning of the datum feature and the identifying region would need to scan the entire component to locate and read the contrast agent. Therefore, using component 100 as an example, forming datum feature 170 enables an end user to determine the position and orientation of component 100 and, based on knowledge of the relative positioning of datum feature 170 and identifying region 154, locate identifying region 154.

Method 200 further includes, at step 230, directing energy from an energy source onto the contrast agents to fuse the contrast agents and the cross sectional layer. In this regard, for example, energy source 104 may be used to fuse contrast agent 120 within surface 112 and/or onto cross sectional layer 110. According to exemplary embodiments, the contrast agent may be deposited along with a primary surface powder and the energy source may selectively fuse portions of the primary surface powder and the contrast agent. According to alternative embodiments, only contrast agent is deposited and fused to form the component identifier.

As described above, method 200 provides one exemplary manner of forming a component having integrally deposited contrast agent that defines a component identifier of the component. It should be appreciated that additional steps may be taken by the manufacturer of the component, the end user of the component, or both, to validate or authenticate the component. In this regard, for example, an end user may authenticate a component by locating the datum feature, determining the location of the identifying region, scanning that region to determine the component identifier defined by the contrast agent, and authenticating the component by comparing the component identifier to a reference identifier, as described below.

More specifically, referring now to FIG. 4, an exemplary method 300 for authenticating a component according to an exemplary embodiment of the present subject matter is provided. Method 300 can be used by a customer or end user of a component, e.g., such as the end user of component 100, for validating that the component is authentic and is not a counterfeit component. It should be appreciated that the exemplary method 300 is discussed herein only to describe exemplary aspects of the present subject matter, and is not intended to be limiting.

Method 300 includes, at step 310, locating an identifying region of the component. As explained above, the identifying region includes a selectively positioned contrast agent defining a component identifier of the component. According to an exemplary embodiment, a datum feature may be positioned at a predetermined location relative to the identifying region to assist in locating the identifying region, as described above. In this regard, using component 100 as an example, determining the location of identifying region 154 may include locating datum feature 170, determining the position and orientation of component 100 from datum feature 170 and, based on knowledge of the relative positioning of datum feature 170 and identifying region 154, locating identifying region 154.

After the identifying region is located, step 320 includes obtaining data indicative of the component identifier by interrogating the identifying region of the component with a scanner. For example, this step may include scanning identifying region 154 using scanning device 132 to obtain data regarding the location or pattern of contrast agent deposits.

After data indicative of the component identifier is obtained by the end user, the end user may make a determination regarding authenticity, or transmit the data to a third party, e.g., the manufacturer, for making such a determination. More specifically, step 330 includes obtaining a reference identifier from a database. The reference identifiers may be the component identifier as measured and catalogued in the database by the manufacturer of the component. As explained herein, the database may be stored locally, e.g., in direct communication with or housed within scanning device 132 (e.g., via a controller). Alternatively, the database may be remotely stored (e.g., on a database maintained by the manufacturer) and may be accessed, for example, through a remote computing system over one or more wired or wireless networks.

After the reference identifier is obtained, step 340 includes comparing the component identifier to the reference identifier, and step 350 includes determining the component is authentic if the component identifier matches the reference identifier. Thus, a component is validated if it contains a component identifier that matches a reference identifier in the database. As used herein, the component identifier "matches" the reference identifier if a positive identification or verification may be made between the two parts. In this regard, a 100% identical match is not required, as the component identifier may have degraded or changed during the life of the component, there may be variations in scanner accuracy or calibration, etc. However, there should still be a sufficient resemblance between the component identifier and the reference identifier that a party may, with a reasonable degree of accuracy, determine that the component bearing the component identifier is indeed the same component from which the reference identifier was obtained and catalogued in the database.

As discussed herein, one or more portion(s) of methods 200 and 300 can be implemented by controller 134, by remote computing system 136, or both. Thus, for example, it should be appreciated that according to certain embodiments, the component authentication may be performed by a party other than the end user, e.g., the manufacturer. In such an embodiment, the end user may transmit the component identifier as measured from the component to the manufacturer. The manufacturer may then perform steps 330 through 350—i.e., obtain the reference identifier, compare the reference identifier and the component identifier, and make a determination regarding authenticity. If the component is determined to be authentic, the manufacturer may then transmit a signal to the end user indicating that the component is authentic. By contrast, if the component identifier does not match a reference identifier from the database, the manufacturer may provide an indication to the end user that the component might be a counterfeit.

FIGS. 3 and 4 depict steps performed in a particular order for purposes of illustration and discussion. Those of ordinary skill in the art, using the disclosures provided herein, will understand that the steps of any of the methods discussed herein can be adapted, rearranged, expanded, omitted, or modified in various ways without deviating from the scope of the present disclosure. Moreover, although aspects of methods 200, 300 are explained using component 100 as an example, it should be appreciated that these methods may be applied to authenticate any suitable component.

An additively manufactured component and a method for manufacturing and authenticating that component are described above. Using the additive manufacturing methods described herein, the component may include identifying features that are smaller, more complex, and more intricate than possible using prior manufacturing methods. In addition, these features may be difficult or impossible to detect, very difficult to reverse engineer, and nearly impossible reproduce, e.g., for the purpose of producing counterfeit products. For example, the contrast agents may be invisible to the human eye and may be read only using specific scanning methods depending on the type of contrast agent used. Moreover, a suitable scanning device must be directed to a specific identifying region of the component that is unknown to third parties. These contrast agents may be introduced during the design of the component, such that they may be easily integrated into components during the build process at little or no additional cost. The features may also serve as a robust identifier capable of withstanding high temperatures without degradation throughout the life of the component, with little or no impact on the quality of the component. Furthermore, the component identifiers formed by the contrast agents may be authenticated through comparison with previously catalogued reference identifiers.

The methods described herein provide a means of uniquely identifying (e.g., via serial identification) of original equipment manufacturer parts. Moreover, the component identifiers may be generated during an additive manufacturing process or during a post-processing procedure on additively manufactured components or metal components formed using any other manufacturing process. The contrast agents may be small, embedded, and not necessarily visible to the naked eye. Further, the contrast agents may not show up using advanced inspection methods such as x-ray CT or radiography scans. The contrast agents are robust through the life of the part and will persist through heat treats and operation of the component, even at high temperatures. It should be appreciated that any suitable contrast agent may be used to achieve these and other advantages in accordance with embodiments of the present subject matter.

Figure 5:
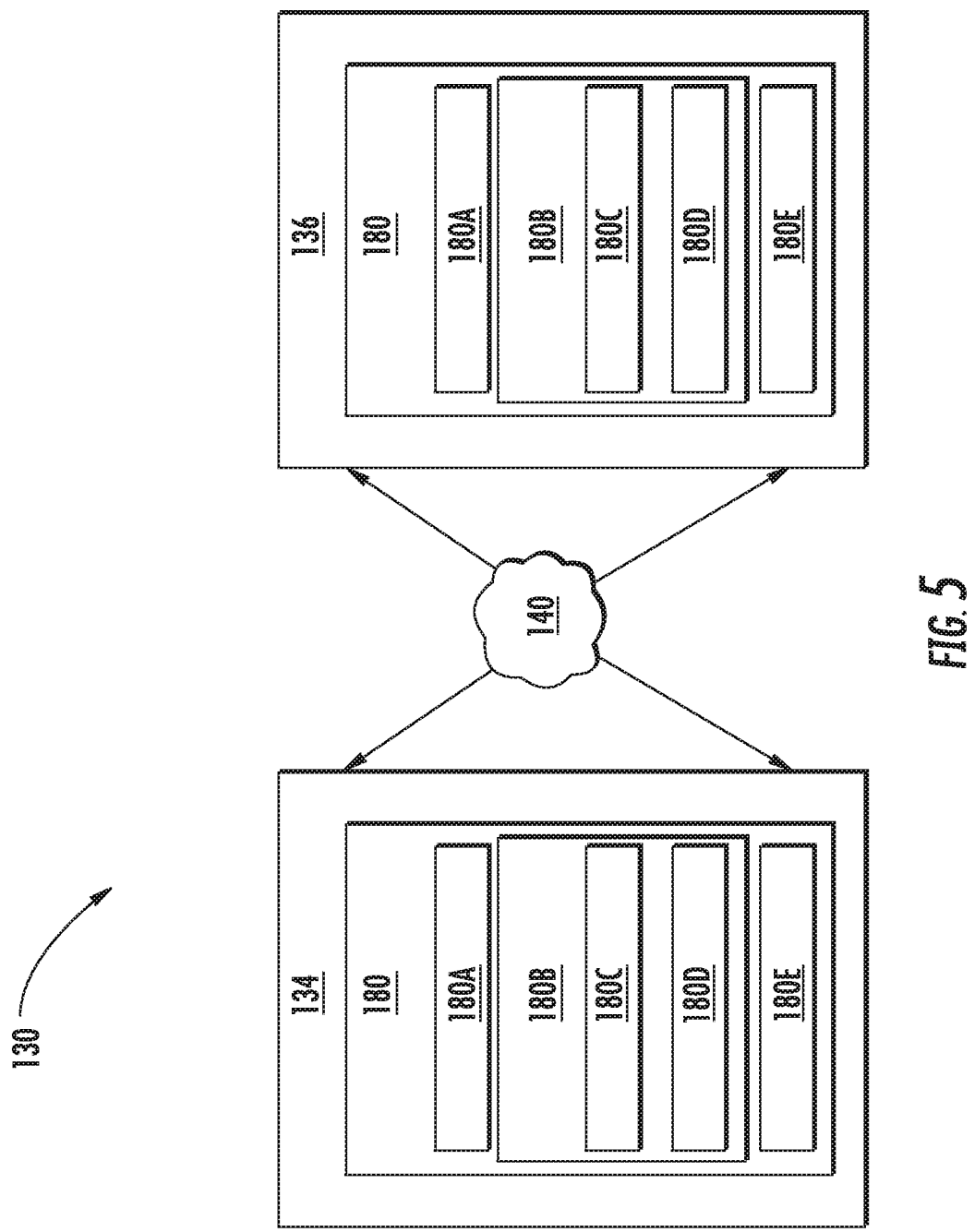
FIG. 5 depicts certain components of an authentication system according to example embodiments of the present subject matter.

FIG. 5 depicts authentication system 130 according to example embodiments of the present disclosure. As shown above in FIG. 2, authentication system 130 can include one or more controllers 134 and/or remote computing systems 136, which can be configured to communicate via one or more network(s) (e.g., network(s) 140). According to the illustrated embodiment, remote computing system 136 is remote from controller 134. However, it should be appreciated that according to alternative embodiments, remote computing system 136 can be included with or otherwise embodied by controller 134.

Controller 134 and remote computing system 136 can include one or more computing device(s) 180. Although similar reference numerals will be used herein for describing the computing device(s) 180 associated with controller 134 and remote computing system 136, respectively, it should be appreciated that each of controller 134 and remote computing system 136 may have a dedicated computing device 180 not shared with the other. According to still another embodiment, only a single computing device 180 may be used to implement methods 200 and 300 as described above, and that computing device 180 may be included as part of controller 134 or remote computing system 136.

Computing device(s) 180 can include one or more processor(s) 180A and one or more memory device(s) 180B. The one or more processor(s) 180A can include any suitable processing device, such as a microprocessor, microcontroller, integrated circuit, an application specific integrated circuit (ASIC), a digital signal processor (DSP), a field-programmable gate array (FPGA), logic device, one or more central processing units (CPUs), graphics processing units (GPUs) (e.g., dedicated to efficiently rendering images), processing units performing other specialized calculations, etc. The memory device(s) 180B can include one or more non-transitory computer-readable storage medium(s), such as RAM, ROM, EEPROM, EPROM, flash memory devices, magnetic disks, etc., and/or combinations thereof.

The memory device(s) 180B can include one or more computer-readable media and can store information accessible by the one or more processor(s) 180A, including instructions 180C that can be executed by the one or more processor(s) 180A. For instance, the memory device(s) 180B can store instructions 180C for running one or more software applications, displaying a user interface, receiving user input, processing user input, etc. In some implementations, the instructions 180C can be executed by the one or more processor(s) 180A to cause the one or more processor(s) 180A to perform operations, as described herein (e.g., one or more portions of methods 200, 300). More specifically, for example, the instructions 180C may be executed to perform a comparison between a reference identifier and a component identifier, to perform an authentication analysis, to transmit an indication of authenticity, etc. The instructions 180C can be software written in any suitable programming language or can be implemented in hardware. Additionally, and/or alternatively, the instructions 180C can be executed in logically and/or virtually separate threads on processor(s) 180A.

The one or more memory device(s) 180B can also store data 180D that can be retrieved, manipulated, created, or stored by the one or more processor(s) 180A. The data 180D can include, for instance, data indicative of reference identifiers associated with authentic additively manufactured components. The data 180D can be stored in one or more database(s). The one or more database(s) can be connected to controller 134 and/or remote computing system 136 by a high bandwidth LAN or WAN, or can also be connected to controller through network(s) 140. The one or more database(s) can be split up so that they are located in multiple locales. In some implementations, the data 180D can be received from another device.

The computing device(s) 180 can also include a communication interface 180E used to communicate with one or more other component(s) of authentication system 130 (e.g., controller 134 or remote computing system 136) over the network(s) 140. The communication interface 180E can include any suitable components for interfacing with one or more network(s), including for example, transmitters, receivers, ports, controllers, antennas, or other suitable components.

The network(s) 140 can be any type of communications network, such as a local area network (e.g. intranet), wide area network (e.g. Internet), cellular network, or some combination thereof and can include any number of wired and/or wireless links. The network(s) 140 can also include a direct connection between one or more component(s) of authentication system 130. In general, communication over the network(s) 140 can be carried via any type of wired and/or wireless connection, using a wide variety of communication protocols (e.g., TCP/IP, HTTP, SMTP, FTP), encodings or formats (e.g., HTML, XML), and/or protection schemes (e.g., VPN, secure HTTP, SSL).

The technology discussed herein makes reference to servers, databases, software applications, and other computer-based systems, as well as actions taken and information sent to and from such systems. It should be appreciated that the inherent flexibility of computer-based systems allows for a great variety of possible configurations, combinations, and divisions of tasks and functionality between and among components. For instance, computer processes discussed herein can be implemented using a single computing device or multiple computing devices (e.g., servers) working in combination. Databases and applications can be implemented on a single system or distributed across multiple systems. Distributed components can operate sequentially or in parallel. Furthermore, computing tasks discussed herein as being performed at the computing system (e.g., a server system) can instead be performed at a user computing device. Likewise, computing tasks discussed herein as being performed at the user computing device can instead be performed at the computing system.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method of manufacturing a component, the method comprising:
    selectively depositing one or more contrast agents within one or more cross sectional layers of the component to define a component identifier of the component, wherein the component identifier comprises a sequence or pattern of encoded information contained within an identifying region;
    directing energy from an energy source onto the contrast agents to fuse the contrast agents and the cross sectional layer; and
    forming a datum feature on the component at a predetermined location and orientation relative to the identifying region such that the datum feature provides a reference for locating and scanning the identifying region.

2. The method of claim 1, wherein the datum feature has a size that is greater than about one millimeter and is visible to the human eye.

3. The method of claim 1, wherein selectively depositing the contrast agents within the cross sectional layer comprises:
    placing a layer of additive material on the cross sectional layer, the layer of additive material comprising a contrast agent selectively positioned within the layer of additive material to form the component identifier.

4. The method of claim 1, wherein the contrast agent is a secondary x-ray emission contrast agent that is read using a secondary x-ray emission spectroscopy method.

5. The method of claim 1, wherein the contrast agent is an electron emission contrast agent that is read using an electron emission spectroscopy method.

6. The method of claim 1, wherein the contrast agent is an ultraviolet contrast agent that is read using an ultraviolet spectrometer, an ultraviolet camera, or an ultraviolet sensor.

7. The method of claim 1, wherein the contrast agent is an infrared contrast agent that is read using an infrared spectrometer, an infrared camera, or an infrared sensor.

8. The method of claim 1, wherein the contrast agent is a radioactive contrast agent that is read using a gamma ray spectrometer or detector.

9. The method of claim 1, wherein the contrast agent is deposited using chemical vapor deposition.

10. A method of additively manufacturing a surface of a component, the method comprising:
    depositing a layer of additive material onto the component, the layer of additive material comprising a contrast agent selectively positioned within an identifying region to form a component identifier of the component;
    directing energy from an energy source onto a portion of the layer of additive material to fuse the portion of the layer of additive material and the contrast agent onto the component; and
    forming a datum feature on the component at a predetermined location and orientation relative to the identifying region such that the datum feature provides a reference for locating and scanning the identifying region.

11. The method of claim 10, wherein the layer of additive material consists only of the contrast agent.

12. The method of claim 10, wherein the layer of additive material comprises the contrast agent selectively positioned within a primary powder, the energy source being directed at a portion of the layer of additive material to fuse together at least a portion of the primary powder and the contrast agent to form the surface.

13. The method of claim 10, wherein the contrast agent is a secondary x-ray emission contrast agent that is read using a secondary x-ray emission spectroscopy method.

14. The method of claim 10, wherein the contrast agent is an infrared contrast agent that is read using an infrared spectrometer, an infrared camera, or an infrared sensor.

15. The method of claim 10, wherein the contrast agent is a radioactive contrast agent that is read using a gamma ray spectrometer or detector.

16. A method of authenticating a component, the method comprising:
    locating a datum feature on the component;
    locating an identifying region of the component by using the datum feature as a reference, the identifying region being located at a predetermined location and orientation relative to the datum feature and comprising a selectively positioned contrast agent defining a component identifier;

obtaining data indicative of the component identifier by interrogating the identifying region of the component with a scanner; and determining that the component is authentic based on the data acquired by the scanner.

17. The method of claim 1, wherein the datum feature is positioned remotely from the identifying region, is visible to a human eye, and indicates both a position and an orientation of the component.

18. The method of claim 10, wherein the datum feature is positioned remotely from the identifying region, is visible to a human eye, and indicates both a position and an orientation of the component.

19. The method of claim 1, wherein the one or more contrast agents are deposited on a surface of the component.

20. The method of claim 1, wherein the datum feature is formed within an interior of the component.

* * * * *